United States Patent
Wang et al.

(10) Patent No.: US 11,749,501 B2
(45) Date of Patent: Sep. 5, 2023

(54) ION IMPLANTATION APPARATUS

(71) Applicant: NISSIN ION EQUIPMENT CO., LTD., Koka (JP)

(72) Inventors: Jian Wang, Koka (JP); Shinsuke Inoue, Koka (JP); Yuta Iwanami, Koka (JP); Takashi Sakamoto, Koka (JP); Weijiang Zhao, Koka (JP)

(73) Assignee: NISSIN ION EQUIPMENT CO., LTD., Koka (JP)

( * ) Notice: Subject to any disclaimer, the term of this patent is extended or adjusted under 35 U.S.C. 154(b) by 30 days.

(21) Appl. No.: 17/468,879

(22) Filed: Sep. 8, 2021

(65) Prior Publication Data
US 2022/0189736 A1  Jun. 16, 2022

(30) Foreign Application Priority Data

Dec. 14, 2020 (JP) .................. 2020-206842

(51) Int. Cl.
  *H01J 37/20* (2006.01)
  *H01J 37/317* (2006.01)
  *H01J 37/304* (2006.01)

(52) U.S. Cl.
  CPC .......... *H01J 37/3171* (2013.01); *H01J 37/20* (2013.01); *H01J 37/304* (2013.01); *H01J 2237/31706* (2013.01)

(58) Field of Classification Search
  CPC ...... H01J 37/3171; H01J 37/20; H01J 37/304; H01J 2237/31706; H01J 2237/2065; H01L 21/046
  USPC .......................................... 250/492.1–492.3
  See application file for complete search history.

(56) References Cited

U.S. PATENT DOCUMENTS

| | | | |
|---|---|---|---|
| 6,930,316 B2 | 8/2005 | Nishihashi et al. | |
| 8,225,683 B2 | 7/2012 | Bailey, III | |
| 9,620,402 B2* | 4/2017 | Kodama | H01L 21/681 |
| 2002/0066872 A1* | 6/2002 | Nishihashi | H01J 37/3171 |
| | | | 250/492.21 |
| 2009/0181527 A1* | 7/2009 | Saito | C04B 35/532 |
| | | | 438/514 |
| 2015/0155194 A1* | 6/2015 | Kuo | C04B 37/00 |
| | | | 156/89.15 |

FOREIGN PATENT DOCUMENTS

| | | |
|---|---|---|
| JP | 2002-176005 A | 6/2002 |
| JP | 2003-208869 A | 7/2003 |
| JP | 2011-504290 A | 2/2011 |
| JP | 2014-120596 A | 6/2014 |
| JP | 2016-063028 A | 4/2016 |

OTHER PUBLICATIONS

Japanese Office Action for corresponding JP 2020-206842, dated Feb. 17, 2021.

* cited by examiner

*Primary Examiner* — Michael Maskell
(74) *Attorney, Agent, or Firm* — Sughrue Mion, PLLC

(57) ABSTRACT

An ion implantation apparatus includes a transfer device that transfers a wafer, a support device that supports the wafer at an implantation position, and a control device that controls the ion implantation apparatus to perform chain implantation processing on the wafer, and that controls the transfer device or the support device according to warpage information of the wafer.

20 Claims, 16 Drawing Sheets

ION IMPLANTATION APPARATUS

CROSS-REFERENCE TO RELATED APPLICATION

This application claims priority from Japanese Patent Application No. JP 2020-206842, filed Dec. 14, 2020 in the Japanese Patent Office, the entire contents of which is incorporated by reference herein in its entirety.

BACKGROUND

1. Field

The present disclosure relates to an ion implantation apparatus that performs ion implantation processing plural times with respect to the entire surface of a wafer, while changing an ion implantation condition.

2. Description of Related Art

An implantation technique, called "multi-stage implantation" or "chain implantation", performs ion implantation processing plural times with respect to an entire surface of one wafer, while changing an ion implantation condition, such as ion beam energy or ion implantation amount, every time the ion implantation processing is performed. As the ion implantation is performed, a temperature of the wafer increases tending to cause a strain on the wafer.

SUMMARY

According to an aspect of one or more embodiments, there is provided an ion implantation apparatus comprising a transfer device that transfers a wafer; a support device that supports the wafer at an implantation position; and a control device that controls the ion implantation apparatus to perform ion implantation processing on the wafer a plurality of times with respect to an entire surface of the wafer, while changing an implantation condition, and that controls the transfer device or the support device according to warpage information of the wafer.

According to another aspect of one or more embodiments, there is provided an ion implantation apparatus comprising a transfer device that transfers a wafer; a support device that supports the wafer at an implantation position; a temperature adjustment device that adjusts a temperature of the wafer before or after ion implantation processing; and a control device that controls the ion implantation apparatus to perform ion implantation processing on the wafer a plurality of times with respect to an entire surface of the wafer, while changing an implantation condition, and that controls one or more of the transfer device, the support device, or the temperature adjustment device according to warpage information of the wafer.

According to yet another aspect one or more embodiments, there is provided an ion implantation apparatus comprising a platen that comprises a first heater and that supports a wafer at an implantation position during implantation processing; a transfer arm that transfers the wafer between a vacuum spare chamber and the platen; a warpage measuring device that measures a warpage of the wafer; and a control device that controls the ion implantation apparatus to perform chain implantation processing on the wafer at the implantation position, receives warpage information corresponding to the measured warpage, and that controls the transfer arm or the first heater according to the warpage information.

BRIEF DESCRIPTION OF THE DRAWINGS

The above and/or other aspects will become apparent and more readily appreciated from the following description of example embodiments, taken in conjunction with the accompanying drawings of which.

DETAILED DESCRIPTION

Figure 1:
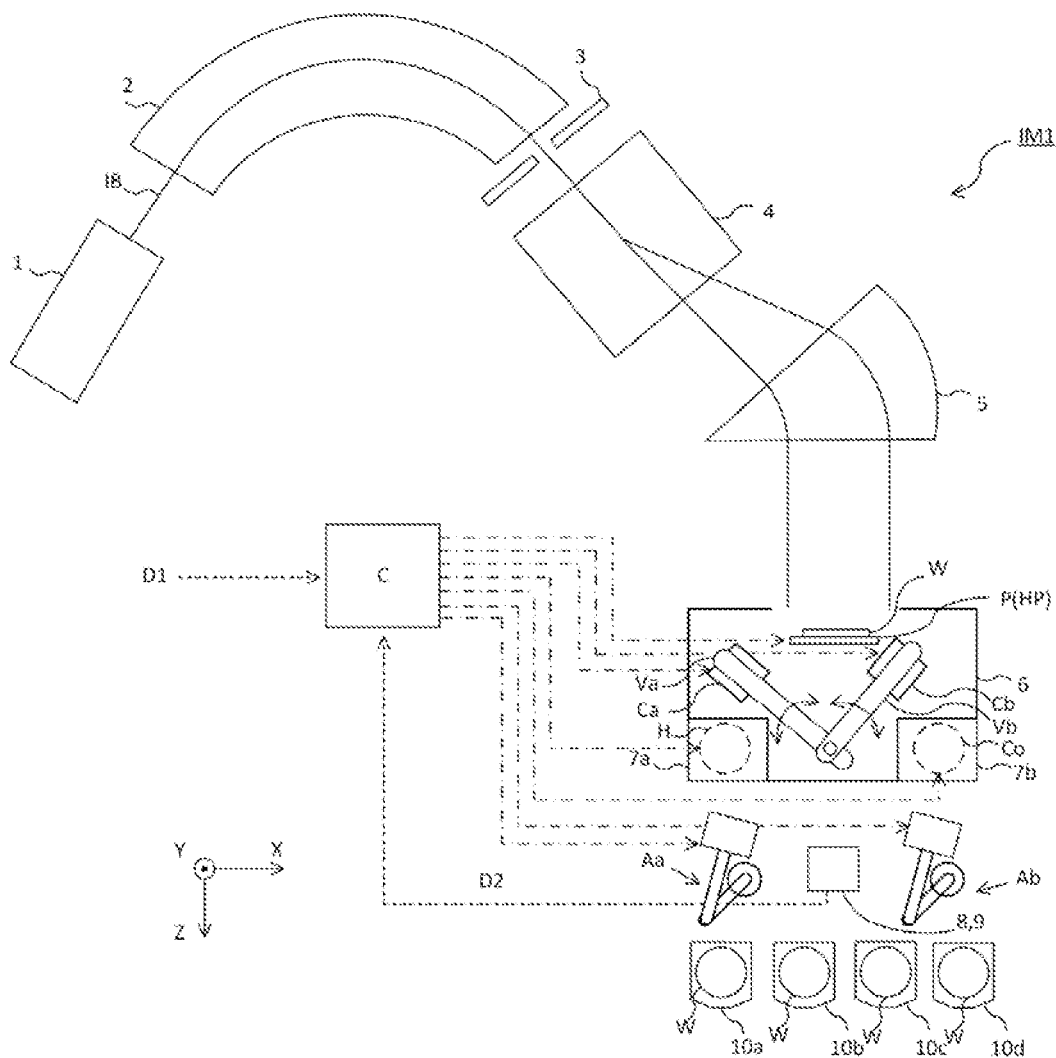
FIG. 1 is a schematic top plan view showing an overall configuration of an ion implantation apparatus according to various embodiments.

Before or after subjecting a wafer to ion implantation processing, a certain strain (warpage) has taken place in the wafer. The strain of the wafer before being subjected to the ion implantation processing is a strain taking place in the wafer during a preceding process prior to the ion implantation processing. On the other hand, the strain of the wafer that has undergone the ion implantation processing arises from the strain taking place in the wafer during the preceding process prior to the ion implantation processing and a strain taking place in the wafer due to a rise in temperature of the wafer caused by the ion implantation processing.

As long as the strain is minor, an influence of the strain may be ignored. That is, an influence of the strain on transfer of the wafer between a processing chamber and a cassette, ion implantation processing with respect to the wafer, a post-process after the ion implantation processing, etc., may be ignored. However, when the strain becomes larger, an influence of the strain on each processing becomes larger, leading to concerns about the occurrence of defective processing or wafer breaking.

In the case where ion implantation processing is performed plural times with respect to the entire surface of one wafer, even though a strain may initially be minor, the minor strains will be accumulated because the ion implantation processing is performed plural times, possibly resulting in a large strain that cannot be ignored.

Further, in some cases in the multi-stage implantation or chain implantation, prior to ion implantation processing a wafer is heated until a temperature of the wafer reaches several hundred degrees C., and then the ion implantation processing is performed with respect to the wafer. This process is called "heated implantation", wherein heating of the wafer is performed by a heater provided in a platen for supporting the wafer in the processing chamber, or a heater disposed in a vacuum chamber.

In the case where ion implantation processing is performed plural times with respect to one wafer, after applying a first ion implantation processing to the wafer which is heated to a high temperature, the resulting wafer is discharged from the processing chamber and returned to a cassette in which the wafer was originally housed. Then, after changing the ion beam energy (implantation condition), the wafer which was previously returned to the cassette is extracted and transferred to the processing chamber. In this process, before starting a second ion implantation processing, the wafer is again heated up to a given temperature. After the wafer is heated to reach the given temperature, the second ion implantation processing is performed with respect to the wafer. The ion implantation processing will be serially repeated a predetermined number of times. Thus, the cycle of heating the wafer and performing the ion implantation is performed multiple times.

In the case where the heated implantation is performed, the strain in the wafer which has undergone the ion implantation processing results from: a strain taking place in the wafer during a preceding process prior to the ion implantation processing (i.e., prior to the initial heating of the wafer); a thermal strain taking place when the wafer is raised in temperature by a heater; and a thermal strain taking place when the wafer is raised in temperature by the ion implantation processing. As described above, in the heated implantation, the number of factors leading to strain in/on the wafer increases. Thus, there is a concern that the strain becomes larger as compared with normal ion implantation processing, i.e., non-heated implantation.

According to various embodiments, the movement of a wafer is controlled based on warpage information on the wafer.

Figure 2:
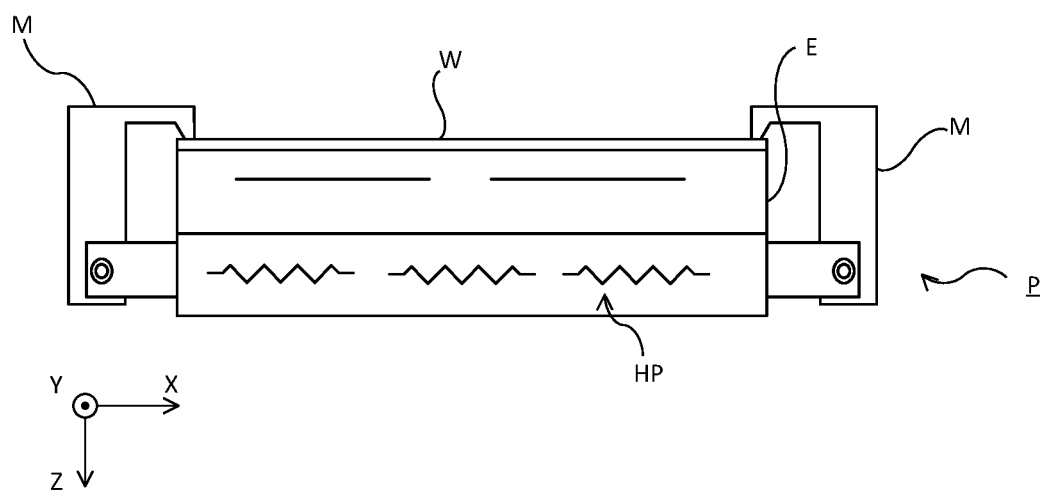
FIG. 2 is an enlarged view of a platen of the ion implantation apparatus of FIG. 1.

FIG. 1 is a schematic top plan view showing an overall configuration of an ion implantation apparatus according to various embodiments. FIG. 2 is an enlarged view of a platen of the ion implantation apparatus of FIG. 1. The configuration of the ion implantation apparatus will be described based on FIGS. 1-2, and specific controls of various devices of the ion implantation apparatus according to wafer warpage information will be described based on FIGS. 3 to 9.

As shown in FIG. 1, an ion implantation apparatus IM1 includes an ion source 1, a mass analysis electromagnet 2, an analysis slit 3, a magnetic field or electric field scanner 4, a collimator magnet 5, a processing chamber 6, a first vacuum spare chamber 7a, a second vacuum spare chamber 7b, an aligner 8, a warpage measuring device 9, and a control device C. The ion implantation apparatus IM1 to be described here may be configured to perform heated implantation.

In FIG. 1, the ion implantation apparatus IM1 extracts a spot-shaped ion beam IB from the ion source 1, and causes the ion beam to pass through the mass analysis electromagnet 2 and the analysis slit 3, thereby removing unnecessary ion components contained in the ion beam.

After mass analysis, the ion beam IB is scanned in one direction by the magnetic field or electric field scanner 4, and led to pass through the collimator magnet 5, thereby parallelizing traveling directions of rays of the ion beam to form ion rays having traveling directions parallel to each other. The resulting ion beam is introduced into the processing chamber 6.

In the processing chamber 6, a wafer W supported by a platen P is mechanically scanned across the ion beam in a Y direction in FIG. 1 by a non-illustrated drive mechanism, thereby performing ion implantation processing with respect to the wafer W. In some embodiments, the wafer W may be a silicon carbide wafer and may have a circular contour. However, this is only an example, and embodiments are not limited thereto.

During passing of the wafer W to the platen P, the platen P is rotated about an X axis in FIG. 1 serving as a rotational axis by a non-illustrated rotation mechanism. As a result of this rotation, a wafer-holding surface of the platen P holding the wafer W is positioned to face upwardly (in a direction perpendicular to the Y direction).

Each of the first and second vacuum spare chambers 7a, 7b is adjacent to the processing chamber 6 and is configured to transfer the wafer W between a vacuum atmosphere and an atmospheric atmosphere. A heater H is disposed inside or outside the first vacuum spare chamber 7a to raise the temperature of the wafer W transferred thereinside.

On the other hand, the second vacuum spare chamber 7b is provided with a cooling mechanism Co for lowering the temperature of the wafer W transferred thereinside (e.g., a gas blowing mechanism configured to blow nitrogen gas toward the side of the wafer).

As for transfer of the wafer W in the vacuum atmosphere, the wafer W is transferred between one of the first and second vacuum spare chambers 7a, 7b and the platen P, by using two transfer arms Va, Vb which are each turnable independently. Each of the two transfer arms Va, Vb is equipped with a holding claw (Ca, Cb) provided on a lower end thereof and configured to support an outer peripheral end of the wafer W.

Alternatively, in some embodiments, instead of the holding claw (Ca, Cb), an electrostatic chuck may be used for holding the wafer during transfer.

As for transfer of the wafer W in the atmospheric atmosphere, the wafer W is transferred between one of the first and second vacuum spare chambers 7a, 7b and one of a plurality of cassettes 10a to 10d, by using two atmospheric robots Aa, Ab. Each of the atmospheric robots Aa, Ab is equipped with a hand configured to vacuum-suck or electrostatically attract a lower surface of the wafer W to hold the wafer W.

The aligner 8 is disposed between the vacuum spare chambers 7a, 7b and the cassettes 10a to 10d to align the circumferential position of the wafer W with reference to a notch or an orientation flat of the wafer W. In the configuration illustrated in FIG. 1, the warpage measuring device 9 is also provided at the same location as that of the aligner 8.

The platen P may be equipped with a heater HP. As shown in FIG. 2, the platen P may include an electrostatic chuck E and a mechanical clamp M to hold the wafer W. The wafer W may be held on the platen P by both the electrostatic chuck E and the mechanical clamp M at ion implantation position. In some embodiments, the wafer W may be held on the platen P by only one of the electrostatic chuck E or the mechanical clamp M, and the heater HP may be provided under the electrostatic chuck E. In some embodiments, the electrostatic chuck may be included in the top part of the platen and the heater HP may be embedded under the electrostatic chuck. However, these configurations are only examples, and other configurations are also contemplated.

In some embodiments, the preprocessing of raising the temperature of the wafer W prior to the ion implantation processing may be performed using one of the heater HP of the platen P or the heater H of the first vacuum spare chamber 7a. In other embodiments, the preprocessing of raising the temperature of the wafer W prior to the ion implantation processing may be performed by both the heater HP of the platen P and the heater H of the first vacuum spare chamber 7a.

The control device C may include a microprocessor or controller and is communicatively coupled to one or more of the transfer arms Va, Vb, the atmospheric robots Aa, Ab, the platen P, the temperature adjustment device 9, the heater HP of the platen P, the heater H, and the cooling mechanism Co, and controls one or more of the transfer arms Va, Vb, the atmospheric robots Aa, Ab, the platen P, the temperature adjustment device 9, the heater HP of the platen P, the heater H, and the cooling mechanism Co of the ion implantation apparatus IM1. In some embodiments, the control device C may also be communicatively coupled to other components of the ion implantation apparatus IM1. Under the above configuration, the control device C receives warpage information corresponding to a warpage of the wafer, and controls a control target of the ion implantation apparatus IM1.

Specific examples of the control target include: a transfer device that transfers the wafer W (e.g., the transfer arms Va, Vb and/or the atmospheric robots Aa, Ab); a support device that supports the wafer W at an implantation position (e.g., the platen P); and/or a temperature adjustment device that raises or lowers the temperature of the wafer W (e.g., the heater HP of the platen P, the heater H, the cooling mechanism Co). The control device C may control one or more of these control targets.

All of the above control targets are highly likely to cause defective implantation and wafer breaking.

The warpage information may include data about a warpage amount of the wafer, a wafer shape, etc. The warpage information received by the control device C may be classified into two types.

A first type of wafer information is first warpage data D1 measured outside the ion implantation apparatus IM1, for example by a non-illustrated warpage measuring device provided separately from the ion implantation apparatus IM1 or by a non-illustrated warpage measuring device provided in an apparatus configured to perform a preceding process prior to the ion implantation processing.

A second type of wafer information is second warpage data D2 measured by the warpage measuring device 9 provided in the ion implantation apparatus IM1.

In some embodiments, one of the first warpage data D1 and the second warpage data D2 is received by the control device C. For example, the warpage information may include data about a warpage amount of the wafer, a wafer shape, etc. In other embodiments, both of the first warpage data D1 and the second warpage data D2 may be received by the control device C.

In a case where the ion implantation apparatus IM1 is equipped with the warpage measuring device 9, the warpage amount may be measured, e.g., when the wafer W is returned from the platen P to one of the cassettes 10a to 10d after completion of the ion implantation processing. That is, in some embodiments, the warpage measuring device 9 may measure the warpage amount during return of the wafer W from the platen to one of the cassettes 10a to 10d after completion of the ion implantation processing. This configuration provides an advantage of being able to more quickly control the control target in response to the measured warpage amount, as compared with a configuration in which a warpage measuring device is provided only separately from the ion implantation apparatus IM1.

FIGS. 3 to 9 are flowcharts showing examples of control according to warpage information of the wafer, according to various embodiments. The control may be with regard to the transfer device (e.g., the transfer arms Va, Vb, the atmospheric robots Aa, Ab), the support device (e.g., the platen P), and/or the temperature adjustment device (e.g., the heater HP of the platen P, the heater H, the cooling mechanism Co). Specific examples of the control will be described in accordance with the flowcharts in the figures. It should be noted that, in the flowcharts, processes designated by a common reference sign are the same processes.

Figure 3:
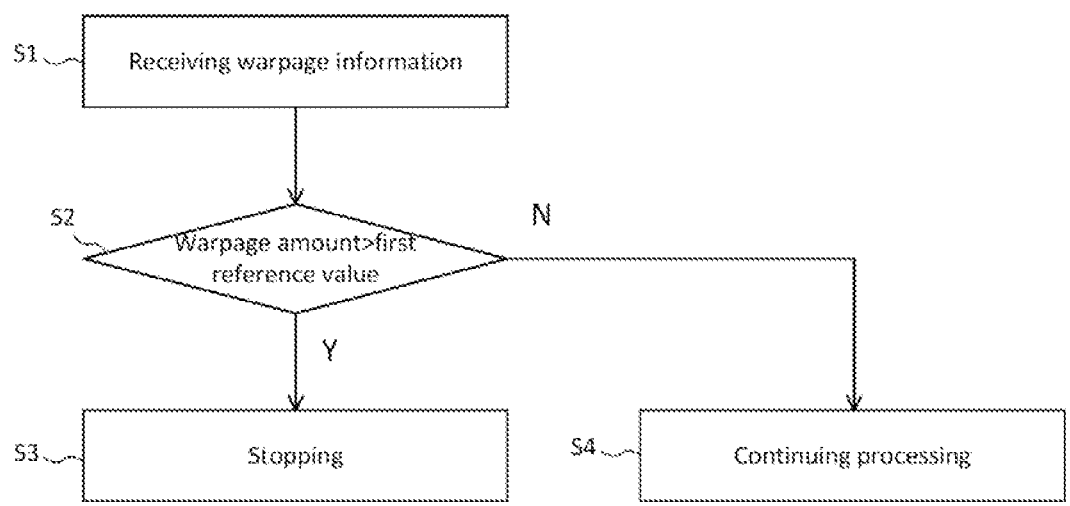
FIG. 3 is an explanatory flowchart of a first example of control according to warpage information, according to an embodiment.

FIG. 3 is an explanatory flowchart of a first example of control according to warpage information of the wafer, according to an embodiment. The control device C receives wafer warpage information (process S1). For example, the warpage information may be the first warpage data D1 and/or the second warpage data D2 described in connection with FIG. 1.

Upon receiving the warpage information, the control device C compares a warpage amount contained in the received warpage information with a first reference value preliminarily stored in the control device C (process S2).

The term "warpage amount" means a numerical value representing how large a warpage arises with respect to a reference plane set on the basis of a flat surface of the wafer obtainable when the wafer has no warpage. In some embodiments, the first reference value may be a value that allows handling, transferring, and holding/chucking of the wafer without any errors. It is noted that an ion implantation apparatus typically may handle a small warpage of the wafer without errors, and the first reference value is intended to include such a small warpage. However, in some embodiments, the first reference value alternatively may be a value of the warpage of the wafer obtained when the wafer has a flat surface and no warpage. In some embodiments, the first reference value may be set experimentally according to the wafer or wafer type being used.

The warpage amount in the wafer surface varies depending on locations on the wafer surface. Thus, in some embodiments, as the numerical value of the warpage amount, an average value in the wafer surface or a numerical value at a specific location may be used.

When the warpage amount is greater than the first reference value, it is evaluated that there is a high probability of the occurrence of defective implantation or wafer breaking during the course of transfer, and thus the transfer device is controlled to stop transfer of the wafer. For example, the transfer device may be controlled to stop transfer of the wafer without extracting the wafer from one of the cassettes, or to, if during the course of transfer, return the wafer to a specific one of the cassettes (process S3).

On the other hand, when the warpage amount is equal to or less than the first reference value, the transfer device, the support device and the temperature adjustment device are controlled to continue the ion implantation processing (process S4).

Figure 4:
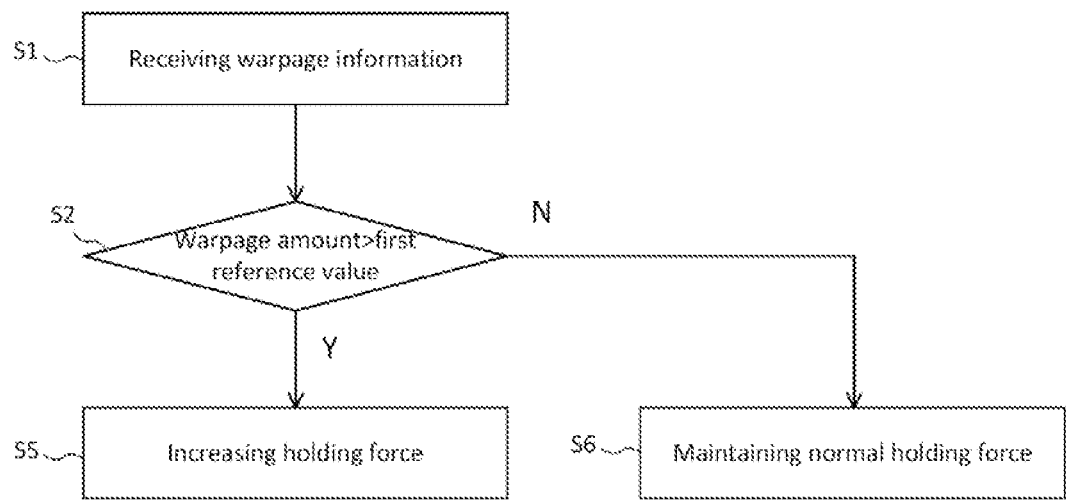
FIG. 4 is an explanatory flowchart of a second example of the control according to the warpage information, according to an embodiment.

FIG. 4 is an explanatory flowchart of a second example of the control, according to an embodiment.

In the second example, when the warpage amount is determined to be greater than the first reference value, the transfer device and the support device are controlled such that a wafer holding force thereof becomes stronger than a wafer holding force in a normal state, so as to prevent the occurrence of wafer breaking due to drop-off of the wafer during the course of transfer thereof (process S5). As used in this specification, the term "normal state" refers to a state that allows handling, transferring, and holding/chucking of the wafer without any errors for a given device, e.g., electrostatic chuck, robot, etc. As discussed above, an ion implantation apparatus typically may handle a small warpage of the wafer without errors, and the normal state is intended to include a state in which such a small warpage occurs. However, in some embodiments, the normal state alternatively may be a state in which the wafer has a flat surface and no warpage.

Specifically, in the case where each of the atmospheric robots Aa, Ab has a hand configured to mechanically clamp, vacuum-suck or electrostatically attract the wafer, the hand is controlled such that a clamping/suction/attraction force thereof becomes stronger than a clamping/suction/attraction force in the normal state. Further, in the case where the platen P comprises an electrostatic chuck configured to electrostatically attract the wafer W, the electrostatic chuck is controlled such that an electrostatic attraction force thereof becomes stronger than an electrostatic attraction force in the normal state.

On the other hand, when the warpage amount is equal to or less than the first reference value, the wafer holding force of each of the devices is maintained at the same value as that in the normal state (process S6).

Figure 5:
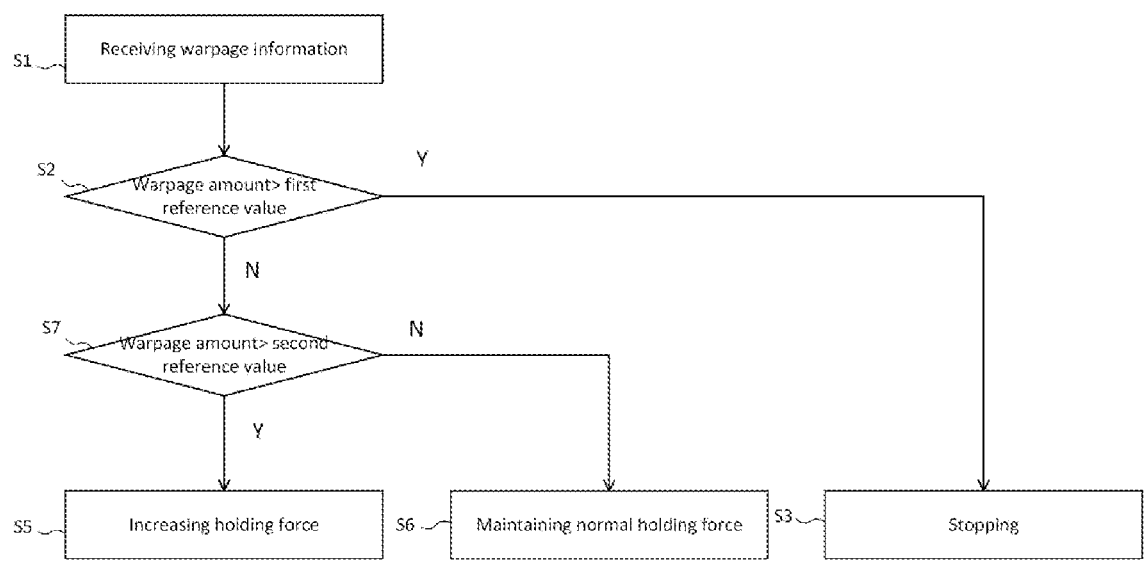
FIG. 5 is an explanatory flowchart of a third example of the control according to the warpage information, according to an embodiment.

FIG. 5 is an explanatory flowchart of a third example of the control, according to an embodiment.

In the process S2, when the warpage amount is equal to or less than the first reference value, the warpage amount is compared with a second reference value (process S7). The second reference value may be less than the first reference value. If the warpage amount is greater than the second reference value, the process S5 is performed, otherwise the process S6 is performed. In this way, a plurality of reference values may be set in a stepwise manner.

Figure 6:
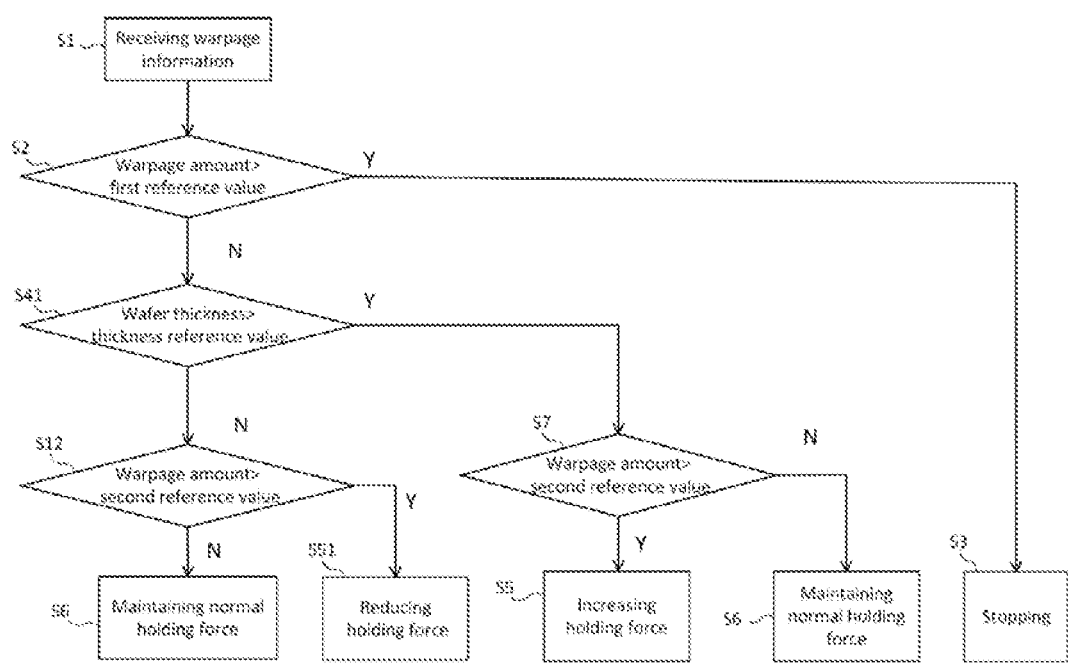
FIG. 6 is an explanatory flowchart of a fourth example of the control according to the warpage information, according to an embodiment.

FIG. 6 is an explanatory flowchart of a fourth example of the control, according to an embodiment.

In the fourth example in FIG. 6, a process of comparing the thickness of a wafer to be handled with a thickness reference value is added. Processes S1 and S2 are performed. When the warpage amount is greater than the first reference value (S2, Y), the process S3 is performed. Other the other hand, when the warpage amount is equal to or less than the first reference value (S2, N), a relatively thin wafer may be more easily broken than a relatively thick wafer. Thus, a determination as to whether the thickness of the wafer is greater than a thickness reference value is performed (process S41).

In the process S41, when the thickness is greater than the thickness reference value (S41, Y), the process S7 and the process S5 or S6 mentioned in the third example in FIG. 5 are performed.

On the other hand, when the thickness is equal to or less than the thickness reference value (S41, N), it is determined whether the warpage amount is greater than the second reference value (process S12). When the warpage amount is greater than the second reference value, the wafer to be handed is evaluated such that it has a relatively small thickness and a relatively large warpage. If such a wafer is forcefully sucked or attracted, it is concerned that the wafer is broken. Thus, in the fourth example, as a measure against wafer breaking, when the warpage amount is greater than the second reference value (S12, Y), the holding force of the transfer device, etc. is reduced (process S51).

When the holding force is reduced in the process S51, it is possible to avoid the wafer breaking, but instead it is considered that the transfer of the wafer may fail to be normally performed, i.e., without dropping the wafer.

Figure 7:
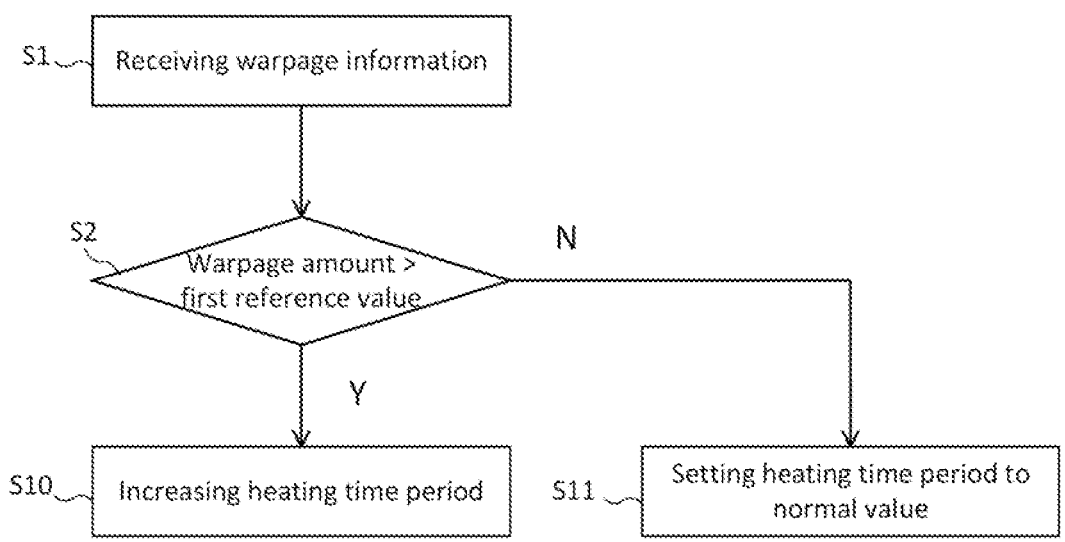
FIG. 7 is an explanatory flowchart of a fifth example of the control according to the warpage information, according to an embodiment.

In this regard, the after-mentioned fifth example of the control in FIG. 7 may be used in combination to allow the wafer to be normally transferred, i.e., without dropping the wafer.

FIG. 7 is an explanatory flowchart of a fifth example of the control, according to an embodiment.

The processes S1 and S2 are performed. In the process S2, when the warpage is greater than the first reference value, the temperature adjustment device is controlled such that a wafer heating time period becomes longer than a wafer heating time period in the normal state to sufficiently flatten the warpage of the wafer (process S10). Then, the wafer is transferred.

On the other hand, when the warpage is equal to or less than the first reference value, the temperature adjustment device is controlled such that the wafer heating time period is set to a normal setup time period (process S11). As used in this specification, the term "normal setup time period" refers to a setup time period for heating a wafer which is flat and has no warpage. In the fifth example in FIG. 7, the wafer heating time period is changed according to the warpage amount. In other embodiments, as for lowering the temperature of the wafer by cooling, alternatively a wafer cooling time period may be changed according to the warpage amount.

In some embodiments, instead of or in addition to setting the heating time period or the cooling time period to be greater than a normal setup time period, a temperature rise rate or a temperature fall rate may be changed.

If a rapid temperature change is applied to a wafer having a relatively large warpage, wafer breaking may be more likely to occur. As a measure against such wafer breaking, when a wafer has a relatively large warpage, the temperature rise rate or the temperature fall rate may be set to change gently. Here, as a result of setting the temperature rise rate or the temperature fall rate to change gently, the temperature of the wafer is likely to fail to reach a given temperature within a given time period. In this situation, the wafer heating time period or the wafer cooling time period may be set longer than the normal setup time period.

In a case where a wafer is heated by the temperature adjustment device to flatten the warpage of the wafer, it is advantageous to minimize a time period between the warpage measurement and the flattening, in view of wafer breaking during the course of transfer of the wafer.

For example, in the case where a wafer is transferred from one of the cassettes 10a to 10d to the processing chamber 6, when the warpage measuring device 9 determines that the warpage of the wafer is greater than the reference value, the wafer is subjected to heating treatment in the vacuum spare chamber 7a provided in a stage preceding the platen P, thereby flattening the warpage of the wafer.

Figure 8:
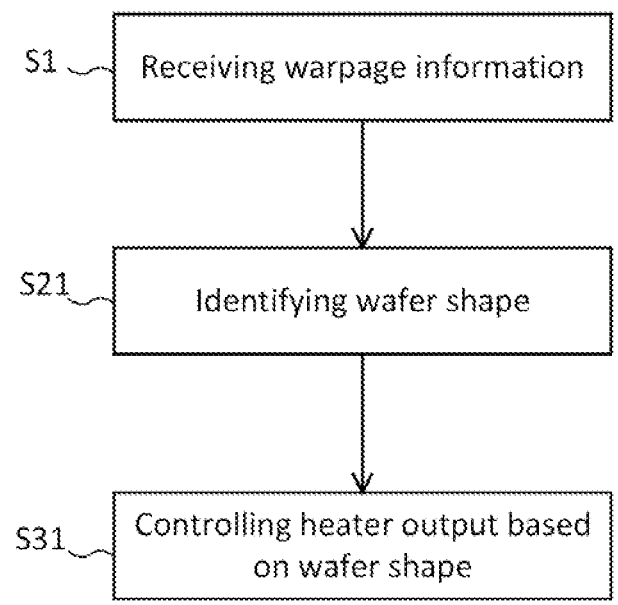
FIG. 8 is an explanatory flowchart of a sixth example of the control according to the warpage information, according to an embodiment.

FIG. 8 is an explanatory flowchart of a sixth example of the control, according to an embodiment.

The shape of a warped wafer can be roughly classified into three types (convex type, concave type, and potato chip type) according to strains in the wafer surface.

The convex type denotes a shape in which a central part of the circular wafer protrudes upwardly with respect to a peripheral part thereof. On the other hand, the concave type denotes a shape in which the central part of the circular wafer protrudes downwardly with respect to the peripheral part thereof. The potato chip type denotes a shape which does not fall into the convex type or the concave type, i.e., a shape in which a plurality of convex-concave areas are distributed in the wafer surface.

In the sixth example, from the received warpage information, a shape of the wafer is identified (process S21). For example, the shape of the wafer may be determined as the convex type, the concave type, or the potato chip type. A heater output is controlled based on the identified wafer shape (process S31).

It should be noted that the received wafer information in the sixth example includes data about warpage amounts at a plurality of positions on the wafer surface from which the wafer shape may be derived. However, in some embodiments, the wafer information may include data about the wafer shape.

In a case where the wafer is heated by a patterned heater comprising a plurality of heating elements arranged concentrically and controllable independently, assuming that the wafer shape is the convex type, and the purpose of heating is flattening of a wafer, the heater output may be controlled, e.g., such that the heat output of one or more of the heating elements corresponding to the central part of the wafer is set to be greater than the heat output of one or more of the heating elements corresponding to the peripheral part of the wafer. On the other hand, assuming that the wafer shape is the convex type, and the purpose of heating is prevention of breaking of a wafer, the heater output may be controlled, e.g., such that the heat output of one or more of the heating elements corresponding to the central part of the wafer is set to be less than the heat output of one or more of the heating elements corresponding to the peripheral part of the wafer.

The pattern of the heating elements is not limited to a concentric pattern, but any of various other patters such as a lattice pattern or a comb teeth pattern may be employed.

Figure 9:
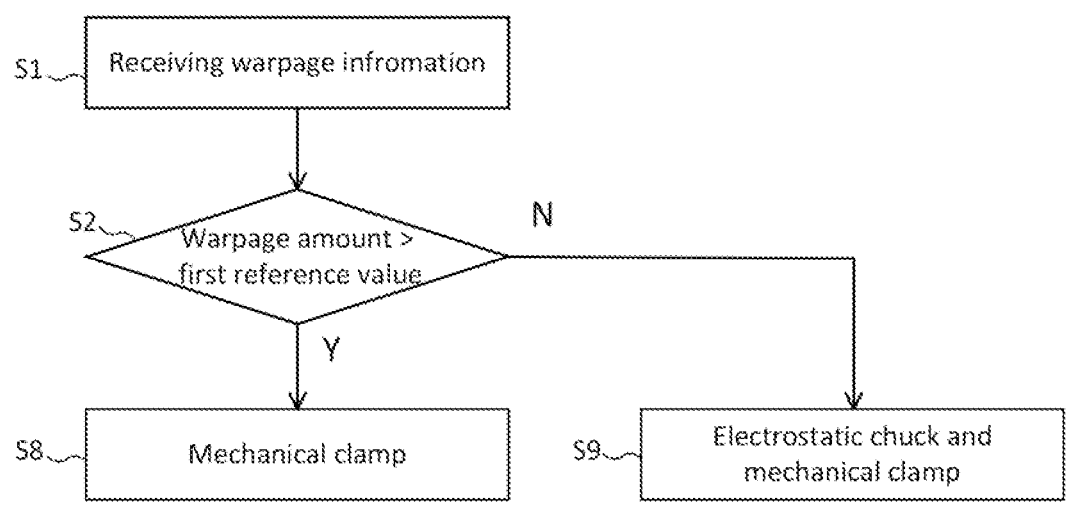
FIG. 9 is an explanatory flowchart of a seventh example of the control according to the warpage information, according to an embodiment.

FIG. 9 is an explanatory flowchart of a seventh example of the control, according to an embodiment.

In a case where the platen P holds the wafer W using both an electrostatic chuck and a mechanical clamp, the electrostatic chuck and/or the mechanical clamp may be selected according to the warpage amount of the wafer, so as to reduce the occurrence of detective defective implantation or wafer breaking.

In the process S2, when the warpage of the wafer is greater than the first reference value, the platen P is controlled to hold the wafer only by the mechanical cramp (process S8). On the other hand, when the warpage of the wafer is equal to or less than the first reference value, the platen P is controlled to hold the wafer using both the electrostatic chuck and the mechanical cramp (process S9).

The platen P is equipped with a heater as mentioned above, and configured to heat the wafer to a high temperature using the heater, prior to the ion implantation processing. In this heating process, if a wafer having a relatively large warpage is strongly fixed by the electrostatic chuck, a thermal strain existing in the wafer that is heated to a high temperature cannot be relieved, possibly leading to the occurrence of defective implantation or wafer breakage.

A wafer holding force of the mechanical clamp is a force just enough to prevent the wafer from dropping off from the platen, and is weaker than a wafer holding force of the electrostatic chuck. Thus, the wafer held by the mechanical clamp may be slightly displaced, so that, even if strain is caused by heating the wafer to a high temperature, an elongation of the wafer due to the thermal strain may be absorbed.

In the first to seventh examples of the control, the transfer device (e.g., the transfer arms Va, Vb, the atmospheric robots Aa, Ab), the support device (e.g., the platen P) and/or the temperature adjustment device (e.g., the heater HP of the platen P, the heater H of the first vacuum spare chamber 7a, the cooling mechanism Co of the second vacuum spare chamber 7b) in the ion implantation apparatus are controlled according to warpage information of a wafer, so that it becomes possible to reduce the rate of occurrence of defective implantation or wafer breaking due to warpage of the wafer.

Each of the controls in the first to seventh examples is just an example, and embodiments are not limited to such controls.

For example, the process of comparing the thickness of a wafer with the thickness reference value, mentioned in the fourth example, may be incorporated in any of the other examples, i.e., the first to third and fifth to seventh examples. Further, in some embodiments, instead of controlling the holding force of the transfer device, a transfer speed of the transfer device may be controlled according to the warpage amount. As the warpage amount becomes larger, a wafer is more likely to drop off from the transfer device. Thus, for example, when the warpage amount is relatively large, the transfer device may be controlled to transfer the wafer at a lower speed than a speed in the normal state.

Further, according to various embodiments, the above controls described with respect to FIGS. 3-9 may be combined.

Further, although the flowcharts of the above controls have been described by taking the first reference value or the second reference value as a common reference value, a different reference value may be employed for each control target.

The controls in the first to seventh examples are assumed to be configured to compare the warpage amount with a reference value, and, depending on a result of the comparison, change a control parameter, such as the holding force or the heating time period, in a stepwise manner. Alternatively, the control parameter may be changed linearly or curvilinearly.

For example, in order to allow the control parameter to change according to the warpage amount of the wafer, a mathematical function for changing the control parameter is preliminarily registered in the control device C. The control device C may be configured to, upon receiving the warpage information, derive a value of the control parameter using the mathematical function, and control the control target using the derived value.

Figure 10:
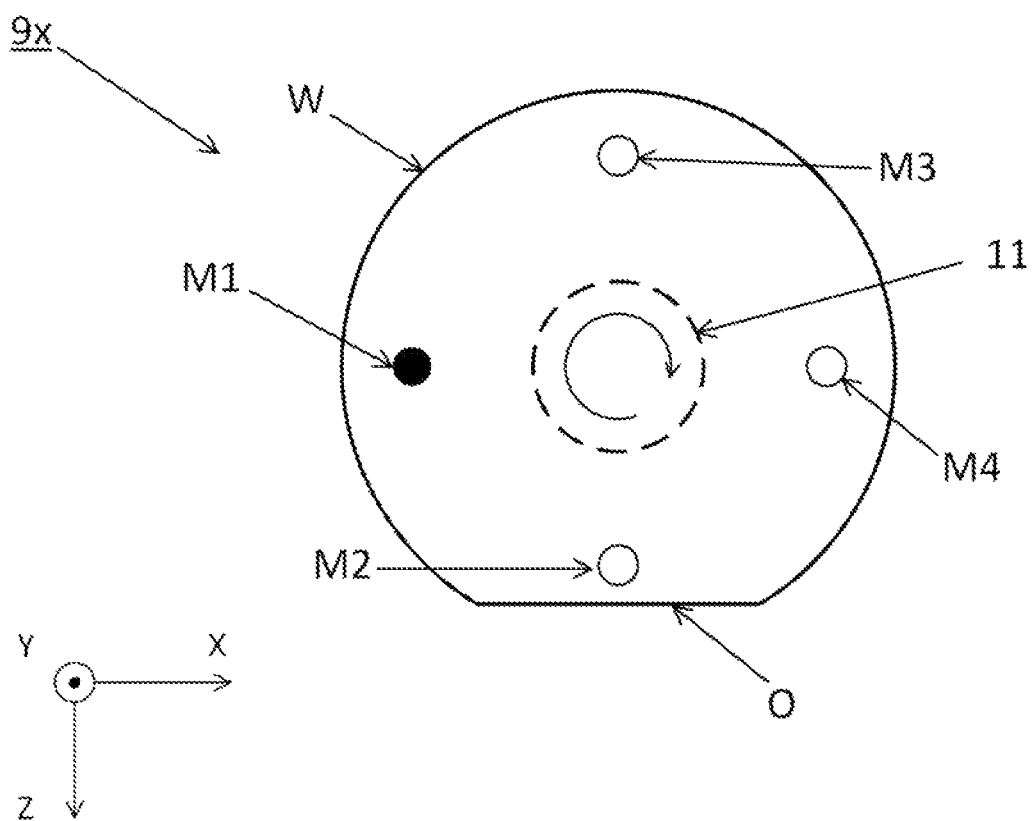
FIG. 10 is an explanatory diagram of a wafer warpage measuring device in a Z-X plane, according to an embodiment.
Figure 11:
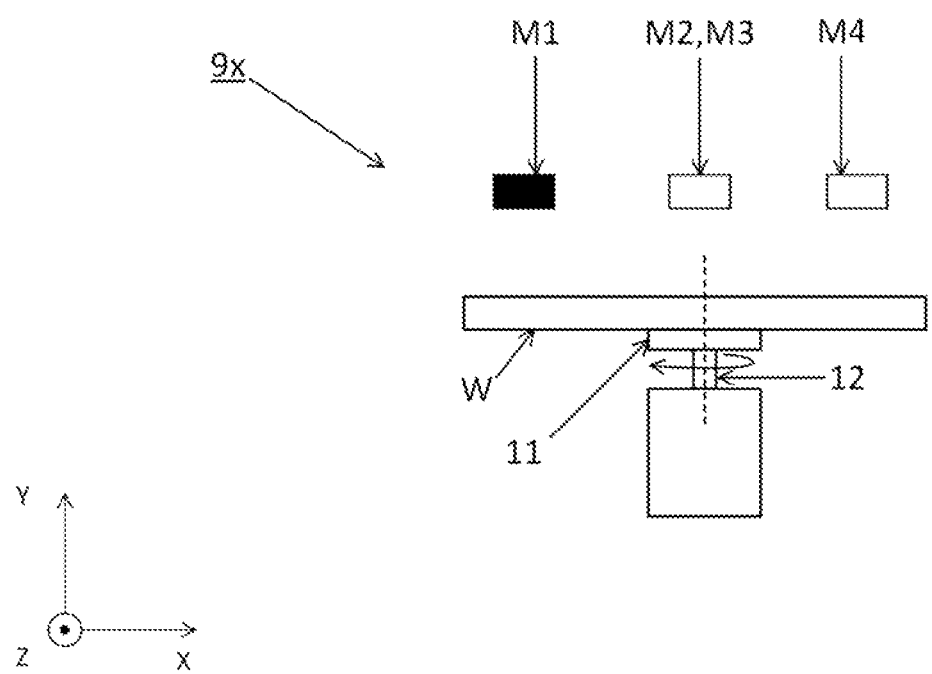
FIG. 11 is an explanatory diagram of the wafer warpage measuring device of FIG. 10, in an X-Y plane.

FIGS. 10 and 11 show a specific example of the warpage measuring device 9, according to an embodiment.

FIGS. 10 and 11 depict a state in which a wafer warpage measurement is performed while a wafer W is disposed on a warpage measuring device 9x.

The warpage measuring device 9x comprises a support portion 11 that supports the vicinity of the center of the wafer W, and a rotating portion 12 (e.g., a rotary shaft) that rotates the wafer W supported by the support portion 11.

In FIGS. 10 and 11, M1 denotes a non-contact type sensor such as a laser displacement meter or a capacitance displacement meter, wherein the sensor M1 is fixed at a specific position. In FIGS. 10 and 11, M2 to M4 denote other measurement positions on the wafer W. When the wafer W is rotated in the direction of the arrowed line in FIG. 10 (i.e., clockwise), a relative positional relationship between the sensor M1 and the wafer W is changed. In this example, the measurement of warpage of the wafer W is performed every time the wafer W is rotated. For example, in some embodiments, the measurement of the warpage of the wafer W may be performed every time the wafer W is rotated 90 degrees.

The wafer W is formed with an orientation flat O (or a notch depending on a type of wafer) indicative of a reference position in a circumferential direction of the wafer W. The warpage measurement by the sensor M1 is performed in a location which is located on an inner side of the wafer W with respect to the orientation flat O in a radial direction of the wafer W and on the outer side with respect to a central region of the wafer W supported by the support portion 11. In other words, the sensor M1 is located at a position between the edge of the support portion 11 and the orientation flat O. This configuration is because the location supported by the support portion 11 lacks accuracy of the warpage measurement.

From a viewpoint of minimizing the number of the warpage measurement positions in the operation of discriminating the shape (the convex-type, the concave-type, the potato chip-type) of a warped wafer, it is advantageous that the measurement of the warpage amount is performed at points which are spaced apart from each other at substantially even intervals in the circumferential direction of the wafer W. For example, the term "substantially even intervals" may include a situation where one or more of the points are deviated from a corresponding one or more of equally-spaced positions by several degrees). In the example illustrated in FIGS. 10 and 11, the warpage measurement is performed at four points arranged at different positions sequentially shifted in the circumferential direction of the wafer by 90 degrees.

With a view to obtaining more detailed warpage data, the wafer warpage measurement may be performed at five or more measurement points, instead of at the four measurement points. In this case, for example, the number of measurement points may be increased by increasing the number of measurement points in the circumferential direction of the wafer, or by disposing one or more additional sensors at a different locations in the radial direction of the wafer.

The warpage measuring device 9x has been described as a warpage measuring device of the type comprising the rotating portion 12. Alternatively, in some embodiments, the rotating portion 12 may be omitted, and additional sensors may be disposed at respective locations corresponding to the measurement positions M2 to M4, in addition to the sensor M1.

However, the warpage measuring device in which the rotating portion 12 is omitted requires the provision of sensors equal in number to a number of measurement points of the warpage measurement.

The aligner 8 may comprise a support portion that supports the wafer, and a rotating portion that rotates the wafer, and the aligner 8 may detect the notch or an orientation flat of the wafer W while rotating the wafer W to align the orientation of the wafer in the circumferential direction of the wafer.

The support portion and the rotating portion of the aligner 8 may be also used as the support portion 11 and the rotating portion 12 of the warpage measuring device 9x. In this case, it is possible to lower costs of components, and save space.

It is to be understood that the components of the aligner 8 and the warpage measuring device 9 need not necessarily be used in a shared manner, and in some embodiments, the aligner 8 and the warpage measuring device 9 may be provided independently.

In the warpage measurement, various methods may be used as a way to set a reference position for determining the warpage amount. The term "reference position" refers to a surface position of a flat water at the warpage measuring device that is used as a reference position to calculate the warpage amount of the wafer under treatment.

One is a method configured to calculate the reference position (i.e., a surface position of a flat water at the warpage measuring device) using existing values.

The disposition location of the sensor M1 of the warpage measuring device 9x and the disposition location of the support portion 11 of the warpage measuring device 9x are preliminarily determined. Thus, a location of the wafer W in a state in which the wafer W is supported by the support portion 11 may be approximately calculated from position information of the components. In this process, if a calculated value is obtained without taking into account the thickness of the wafer, an average of actually-measured thickness dimensions of the wafer may be added thereto. In this way, the reference position during the warpage measurement, i.e., the position of an upper surface of a flat wafer having no warpage in a state in which the flat wafer is supported by the support portion 11 may be calculated.

As another method, there is a method configured to set the reference position (i.e., a surface position of a flat water at the warpage measuring device) using actually-measured values.

Although the disposition location of the sensor M1 of the warpage measuring device 9x and the disposition location of the support portion 11 of the warpage measuring device 9x are preliminarily determined, some deviation is likely to occur in mounting position or mounting angle of each component. Such a problem of mounting accuracy may be solved by the method configured to set the reference position using actually-measured values.

Figure 12:
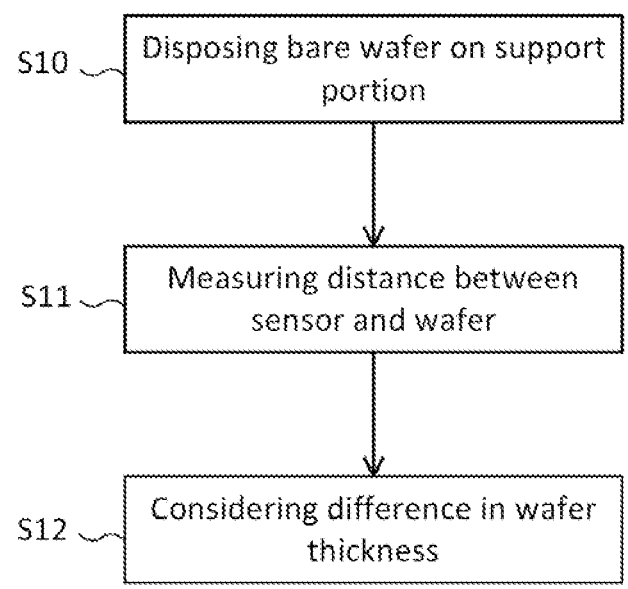
FIG. 12 is a flowchart showing a process of setting a reference position in a wafer warpage measurement, according to an embodiment.

Specifically, the reference position may be set according to the process in the flowchart as shown in FIG. 12. In this example, a wafer to be subjected to the warpage measurement may be, for example, a silicon carbide wafer.

A flat wafer is prepared. For example, a bare wafer of silicon is prepared. Then, the wafer is disposed on the support portion 11 of the warpage measuring device 9x (process S10).

Subsequently, a distance between the sensor M1 and the wafer is measured by the sensor M1 (process S11). For example, the distance may be between the sensor M1 and an upper surface of the wafer W.

The silicon carbide wafer as an object to be subjected to ion implantation and the bare wafer of silicon used in the aforementioned distance measurement are different from each other in terms of a wafer thickness dimension. Since the thickness of the bare wafer of silicon is greater than that of the silicon carbide wafer, a difference between the thickness dimensions of the two wafers is considered (process S12). For example, the difference between the thickness dimensions of the two wafers may be subtracted from the actually-measured distance. In this way, the reference position during the warpage measurement may be set.

Although the problem of mounting accuracy may be solved by setting the reference position using actually-measured values, it may be said that an error is slightly included in such a reference position, because an average of thickness dimensions in the wafer surface is employed as the wafer thickness dimension used in the calculation in the process S12. In order to solve this error problem, a warpage measuring device 9y as shown in FIGS. 13 and 14 may be used.

Figure 13:
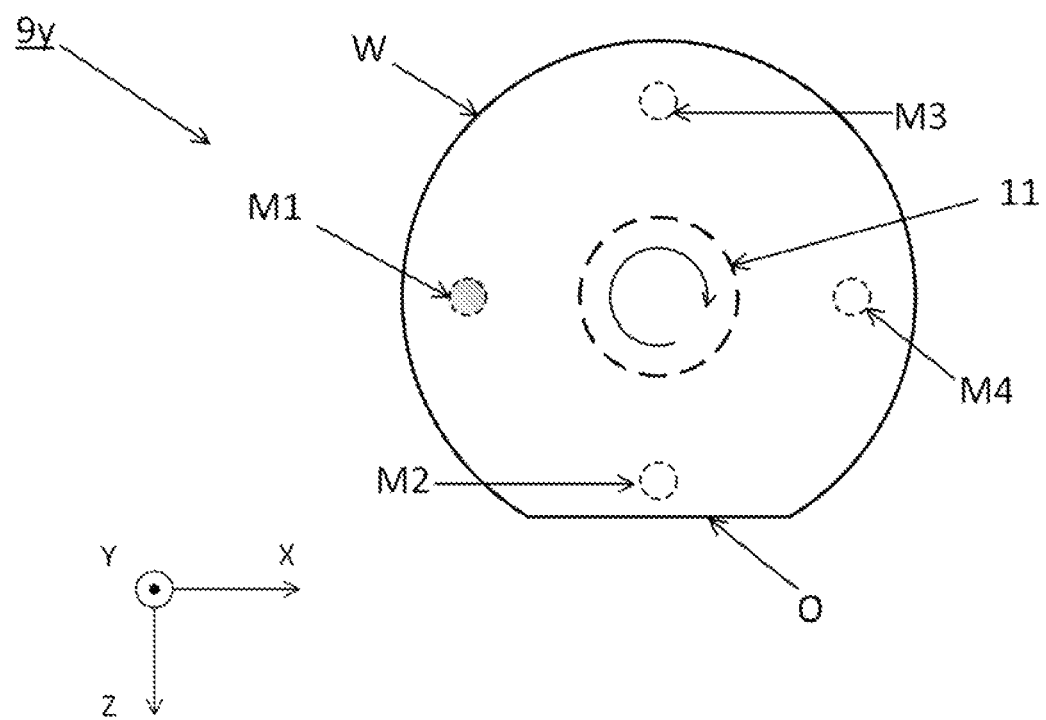
FIG. 13 is an explanatory diagram of a wafer warpage measuring device in the Z-X plane, according to an embodiment.
Figure 14:
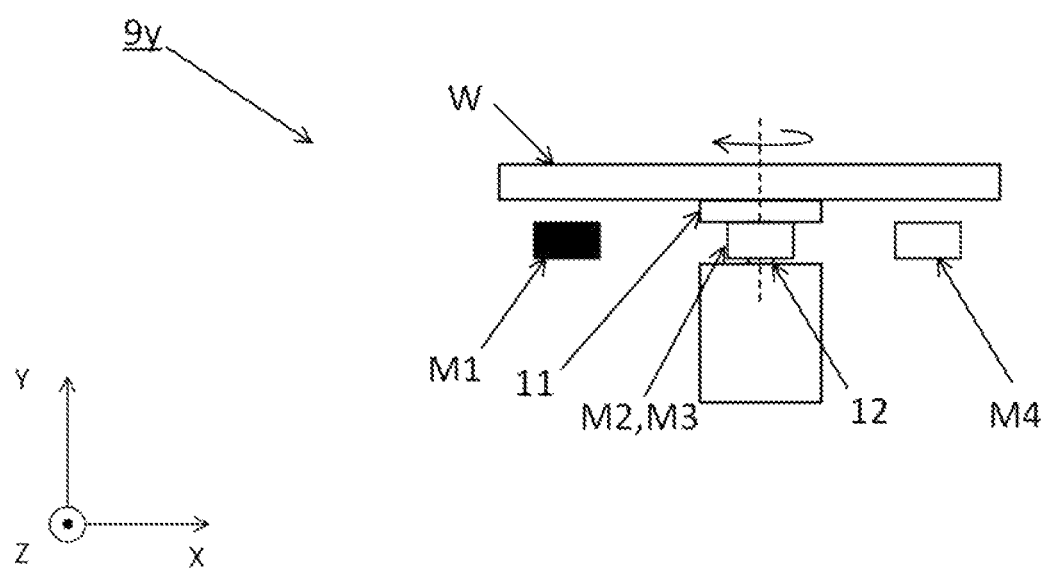
FIG. 14 is an explanatory diagram of the wafer warpage measuring device of FIG. 13, in the X-Y plane.

FIGS. 13 and 14 show a specific example of the warpage measuring device 9, according to an embodiment. A difference between the warpage measuring device 9y illustrated in FIGS. 13 and 14 and the warpage measuring device 9x illustrated in FIGS. 10 and 11 is mainly in the disposition location of the sensor M1 with respect to the wafer surface. The warpage measuring device 9y is configured such that the sensor M1 is disposed underneath the wafer W. In the configuration in which the sensor M1 is disposed underneath the wafer W, when the reference position is set based on actual measurement, as in the flowchart in FIG. 12, a distance to the position of a lower surface of the bare wafer of silicon is measured. The position of the lower surface of the bare wafer of silicon is coincident with the position of a lower surface of the silicon carbide wafer as an object to be subjected to the warpage measurement. That is, since there is no need to consider a difference between thickness dimensions of two heterogeneous wafers, it is possible to more accurately set the reference position.

Figure 15:
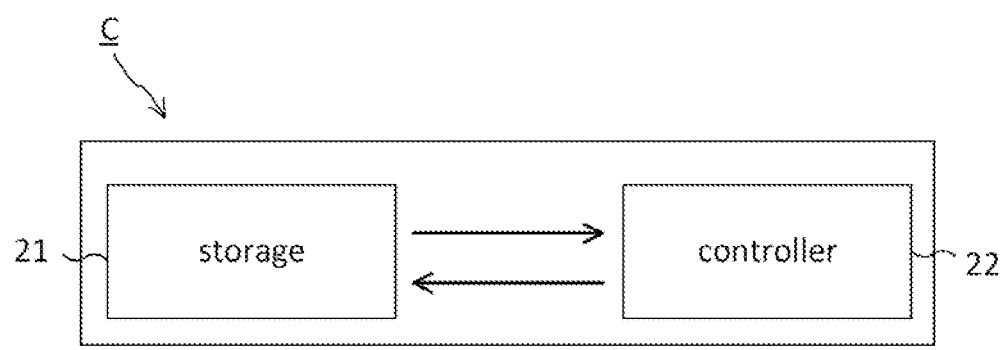
FIG. 15 is an explanatory diagram of a control device, according to an embodiment.

FIG. 15 is an explanatory diagram of a control device. The control device C comprises a storage 21 and a controller 22, as shown in FIG. 15.

The reference value, the mathematical function for deriving a value of the control parameter, values of the control parameter to be switched in a stepwise manner, etc., described in the examples of the control, are stored in the storage 21. These stored data are read by the controller 22, and used by the controller 22 to control the ion implantation apparatus IM1. Additionally, the storage 21 may store computer program code which, when executed by the controller 22, causes the controller to perform the processes described above with respect to the flowcharts of FIGS. 3-9 and 12.

A learning function and an inference function for deriving an optimal control parameter using machine learning may be included in the controller 22.

The controller 22 may be a microprocessor or computer processing unit (CPU) that stores previous data and post-control data in the storage 21. As specific data, control parameters for use in performing respective controls of the devices, the wafer thickness, the wafer information, the warpage amount, the wafer shape, and/or data about occurrence of wafer breaking or defective implantation, etc., may be stored in association with each other. The leaning function of the controller 22 is enhanced by using the specific data as teaching data.

The inference function of the controller 22 is configured to derive a value of an optimal control parameter for controlling each of the control targets, as an objective variable, using wafer information such as the wafer shape, the wafer thickness and the warpage amount stored in the storage 21, as an explanatory variable, and perform control of each device based on the derived value.

The above embodiment has been described based on an example where the transfer device comprises the two transfer arms Va, Vb that are turnable independently. However, if throughput of the ion implantation is not considered, in some embodiments, the number of the transfer arms may be one.

Further, in some embodiments, two aligners 8 may be arranged one above the other in a two-stage manner in the Y direction in FIG. 1, and the warpage measuring device 9 may be attached to each of the aligners 8.

In multi-stage implantation, ion implantation may be performed plural times, while changing an implantation condition such as ion beam energy, an implantation amount, or other parameter (e.g., beam current or ion species). Comparing each ion implantation process in multi-stage implantation, a wafer position (trajectory in which the wafer is scanned) in the Z direction in FIG. 1 does not change.

As for switching of the implantation condition, in some embodiments, the implantation condition may be switched per lot processing. Specifically, in some embodiments, after one lot of wafers are sequentially subject to the ion implantation processing under the same implantation condition, the implantation condition may be changed to perform the ion implantation processing for the one lot of the implanted wafers again.

For heated implantation, the wafer may be transferred to stay between the processing chamber and the cassettes, instead of returning the wafer to one of the cassettes per implantation processing. For example, the multi-stage implantation is performed by: evacuating the implanted wafer to the vacuum spare chamber, or a position inside the processing chamber where the implanted wafer is not irradiated with the ion beam; changing the implantation condition; and then transferring the implanted wafer to the implantation position again.

In the ion implantation apparatus IM1, the system between the ion source 1 and the processing chamber 6 may comprise any other heretofore-known system. For example, a system may be employed which is configured to extract a ribbon beam, in place of the spot beam, and, after subjecting the ion beam to mass analysis and then acceleration/deceleration and deflection, introduce the resulting ion beam into the processing chamber 6.

The control device C is configured to, according to the wafer warpage information, control at least one of the wafer transfer speed, the wafer holding force, the wafer holding means, and the wafer temperature (including one or more of the heating time period, the cooling time period, the temperature rise rate and the temperature fall rate).

Figure 16:
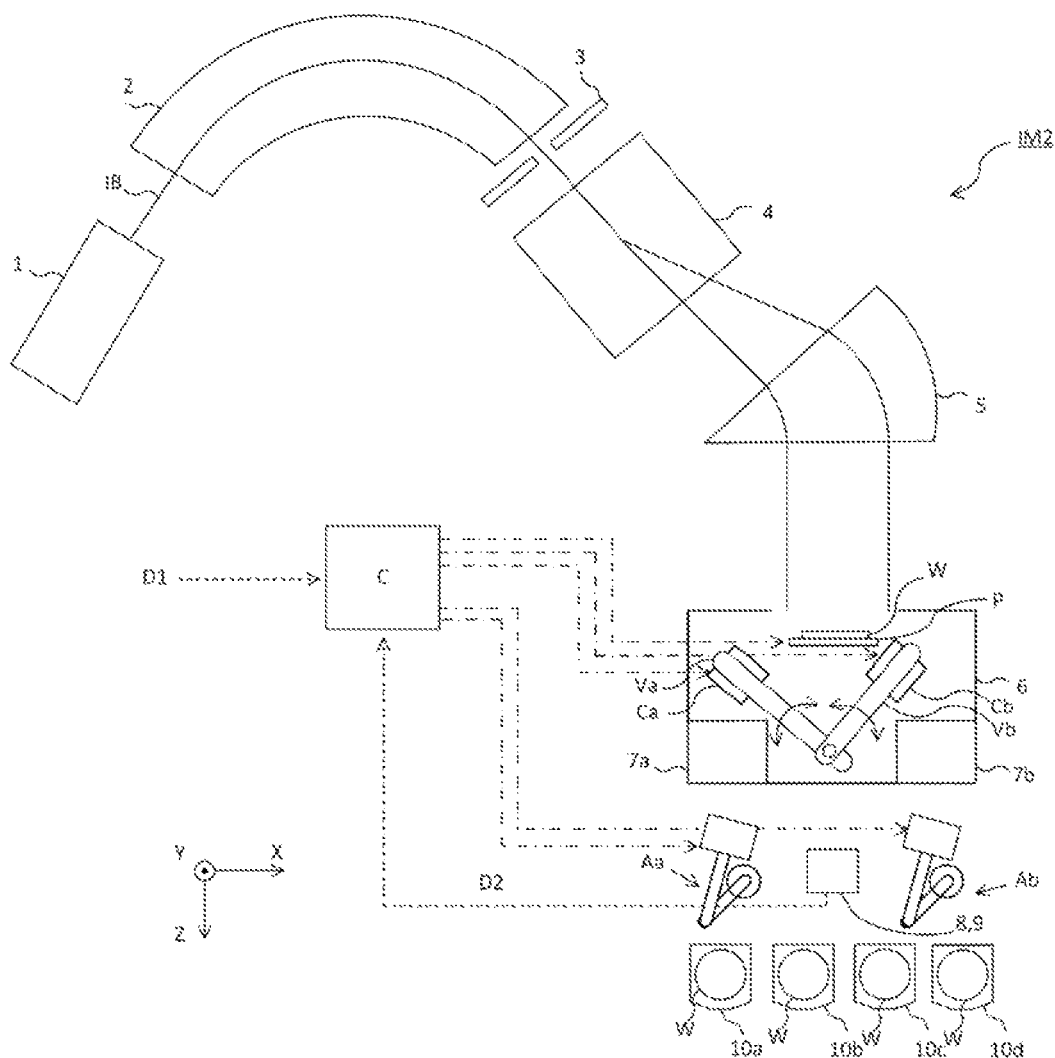
FIG. 16 is a schematic top plan view showing an overall configuration of an ion implantation apparatus according to an embodiment.

FIG. 16 is a schematic top plan view of an ion implantation apparatus IM2 according to another embodiment. A difference from the ion implantation apparatus IM1 in FIG. 1 is in that the ion implantation apparatus IM2 omits the heater H of the first vacuum spare chamber 7a, the cooling mechanism Co of the second vacuum spare chamber 7b, and the heater HP of the platen P.

The ion implantation apparatus IM2, even though heating is not performed by the heater H, the cooling mechanism Co, or the heater HP, a strain (warpage) may take place in a wafer to be transferred to the apparatus or a wafer subjected to the ion implantation processing in the apparatus. Thus, as described in the embodiment illustrated in FIGS. 1-14, the ion implantation apparatus IM2 may be configured to measure the warpage and control each device according to the resulting warpage information. As respective controls of the devices, the controls in FIGS. 3 to 9, except for the control of the temperature adjustment device such as the heater, may be used.

In this case, the control device C is configured to, according to the warpage information, control at least one of the wafer transfer speed, the wafer holding force, and the wafer holding means.

It is to be understood that the present disclosure is not limited to the above embodiments, but various changes and modifications may be made therein without departing from the spirit and scope thereof as set forth in appended claims.

What is claimed is:

1. An ion implantation apparatus comprising:
   a transfer device that transfers a wafer;
   a support device that supports the wafer at an implantation position; and
   a control device that controls the ion implantation apparatus to perform ion implantation processing on the wafer over an entire surface of the wafer a plurality of times, while changing an implantation condition for each implantation of the entire surface of the wafer, and that controls-the transfer device or the support device according to warpage information of the wafer.

2. The ion implantation apparatus as recited in claim 1, further comprising a warpage measuring device that measures a warpage of the wafer and provides the warpage information corresponding to the measured warpage to the control device.

3. The ion implantation apparatus as recited in claim 2, wherein the warpage measuring device is configured to measure the warpage of the wafer at different measurement points in a circumferential direction of the wafer.

4. The ion implantation apparatus as recited in claim 3, wherein a number of the measurement points is 4 or more, and
   wherein the measurement points are spaced apart from each other at substantially even intervals in the circumferential direction of the wafer.

5. The ion implantation apparatus as recited in claim 2, wherein the warpage measuring device comprises:
   a support portion that supports the wafer; and
   a rotating portion that rotates the wafer supported by the support portion,
   wherein the warpage measuring device is configured to measure the warpage of the wafer in a region of the wafer which is not supported by the support portion.

6. The ion implantation apparatus as recited in claim 5, further comprising an aligner that aligns a circumferential orientation of the wafer during transfer of the wafer.

7. The ion implantation apparatus as recited in claim 6, wherein the aligner comprises a support portion that supports the wafer, and a rotating portion that rotates the wafer that is supported by the support portion of the aligner.

8. The ion implantation apparatus as recited in claim 1, further comprising an electrostatic chuck to hold the wafer and a mechanical clamp to hold the wafer,
   wherein the control device is configure to control the ion implantation apparatus to select either only the mechanical clamp to hold the wafer or both the mechanical clamp and the electrostatic chuck to hold the wafer, according to the warpage information of the wafer.

9. The ion implantation apparatus of claim 1, wherein the wafer is a silicon carbide wafer.

10. An ion implantation apparatus comprising:
    a transfer device that transfers a wafer;
    a support device that supports the wafer at an implantation position;
    a temperature adjustment device that adjusts a temperature of the wafer before or after ion implantation processing; and
    a control device that controls the ion implantation apparatus to perform ion implantation processing on the wafer over an entire surface of the wafer a plurality of times, while changing an implantation condition for each implantation of the entire surface of the wafer, and that controls one or more of the transfer device, the support device, or the temperature adjustment device according to warpage information of the wafer.

11. The ion implantation apparatus as recited in claim 10, further comprising a warpage measuring device that measures a warpage of the wafer and provides the warpage information corresponding to the measured warpage to the control device.

12. The ion implantation apparatus as recited in claim 11, wherein the warpage measuring device is configured to measure the warpage of the wafer at different measurement points in a circumferential direction of the wafer.

13. The ion implantation apparatus as recited in claim 12, wherein a number of the measurement points is 4 or more, and
    wherein the measurement points are spaced apart from each other at substantially even intervals in the circumferential direction of the wafer.

14. The ion implantation apparatus as recited in claim 11, wherein the warpage measuring device comprises:
    a support portion that supports the wafer; and
    a rotating portion that rotates the wafer supported by the support portion,
    wherein the warpage measuring device is configured to measure the warpage of the wafer in a region of the wafer which is not supported by the support portion.

15. The ion implantation apparatus as recited in claim 14, further comprising an aligner that aligns a circumferential orientation of the wafer during transfer of the wafer.

16. The ion implantation apparatus as recited in claim 10, further comprising an electrostatic chuck to hold the wafer and a mechanical clamp to hold the wafer,
    wherein the control device is configured to control the ion implantation apparatus to select either only the mechanical clamp to hold the wafer or both the mechanical clamp and the electrostatic chuck to hold the wafer, according to the warpage information of the wafer.

17. The ion implantation apparatus of claim 10, wherein the wafer is a silicon carbide wafer.

18. An ion implantation apparatus comprising:
    a platen that comprises a first heater and that supports a wafer at an implantation position during implantation processing;
    a transfer arm that transfers the wafer between a vacuum spare chamber and the platen;
    a warpage measuring device that measures a warpage of the wafer; and
    a control device that controls the ion implantation apparatus to perform chain implantation processing on a same region of the wafer at the implantation position, receives warpage information corresponding to the measured warpage, and that controls the transfer arm or the first heater according to the warpage information.

19. The ion implantation apparatus as recited in claim 18, wherein the warpage measuring device is configured to measure the warpage of the wafer at different measurement points in a circumferential direction of the wafer.

20. The ion implantation apparatus as recited in claim 18, wherein the wafer is a silicon carbide wafer.

* * * * *